(12) United States Patent  
Lu et al.

(10) Patent No.: US 8,872,138 B2  
(45) Date of Patent: Oct. 28, 2014

(54) GAS DELIVERY FOR UNIFORM FILM PROPERTIES AT UV CURING CHAMBER

(71) Applicant: Taiwan Semiconductor Manufacturing Co., Ltd., Hsinchu Science Park (TW)

(72) Inventors: Yu-Ying Lu, Zhubei (TW); Sung-Po Yang, Longtan Township (TW); Ding-I Liu, Hsinchu (TW); Kuo-Shu Tseng, Taichung (TW); Chung-Wen Chang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/771,112

(22) Filed: Feb. 20, 2013

(65) Prior Publication Data

US 2014/0231671 A1      Aug. 21, 2014

(51) Int. Cl.  
*G21K 5/04* (2006.01)  
*B05D 3/06* (2006.01)

(52) U.S. Cl.  
CPC ........................... *B05D 3/067* (2013.01)  
USPC .................. 250/492.1; 250/492.2; 250/493.1; 250/504 R

(58) Field of Classification Search  
USPC ................ 250/492.1, 492.2, 492.22, 492.23, 250/493.1, 494.1, 504 R  
See application file for complete search history.

(56) References Cited

U.S. PATENT DOCUMENTS

| | | | |
|---|---|---|---|
| 5,644,135 A | 7/1997 | Matheson et al. | |
| 6,223,453 B1 | 5/2001 | Matheson et al. | |
| 2006/0251827 A1 | 11/2006 | Nowak et al. | |
| 2009/0162259 A1* | 6/2009 | Nowak et al. | 422/186.3 |
| 2012/0258259 A1* | 10/2012 | Bansal et al. | 427/558 |
| 2014/0053866 A1* | 2/2014 | Baluja et al. | 134/1.1 |

* cited by examiner

*Primary Examiner* — Nicole Ippolito  
(74) *Attorney, Agent, or Firm* — Duane Morris LLP

(57) ABSTRACT

A UV curing system includes an enclosure defining an interior, a UV radiation source disposed within the interior of the enclosure, and a first window disposed within the interior of the enclosure. The first window creates a barrier that separates the UV radiation source and a processing chamber. A second window is disposed within the interior of the enclosure at a distance from the first window to define a gas channel. The second window defines a plurality of openings such that the gas channel is in fluid communication with the processing chamber. A gas inlet conduit is in fluid communication with the gas channel and is configured to introduce a cooling gas into the gas channel. A gas outlet is in fluid communication with the processing chamber and is configured to remove gas from the processing chamber.

20 Claims, 6 Drawing Sheets

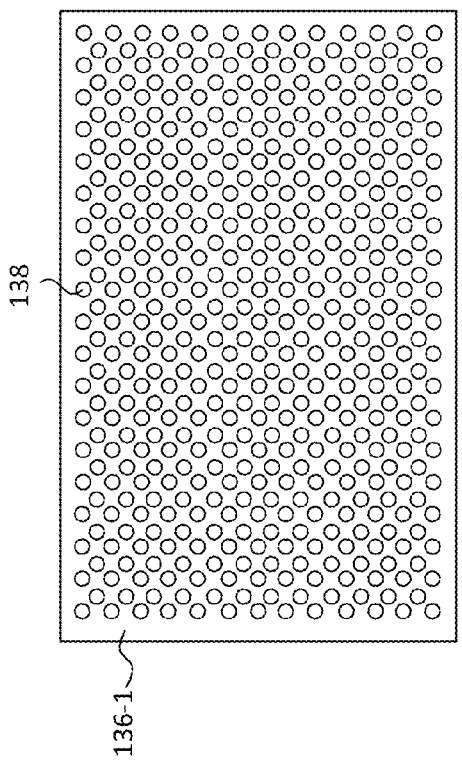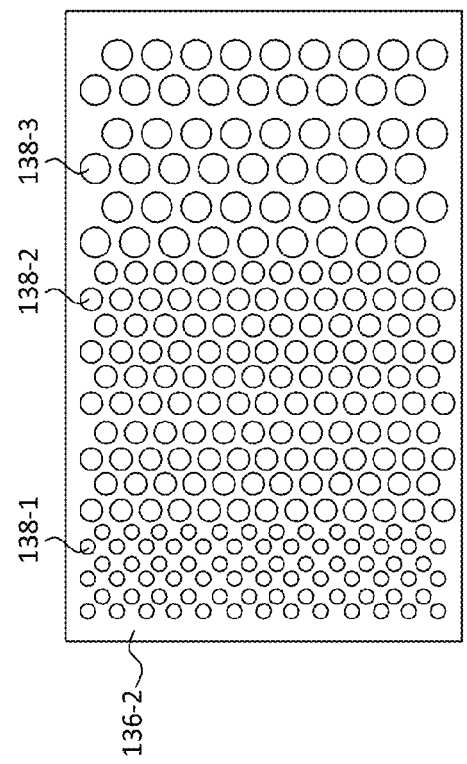

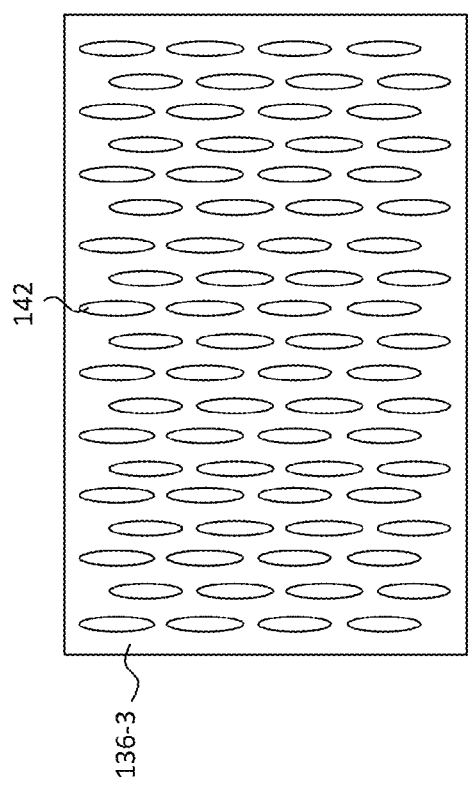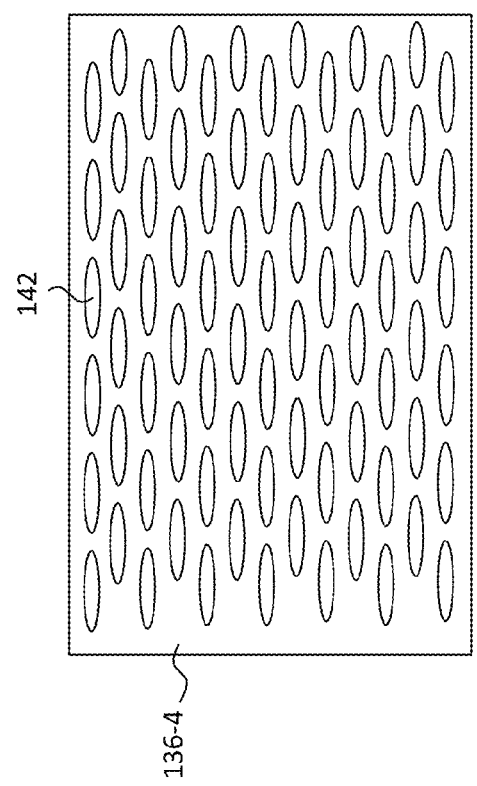

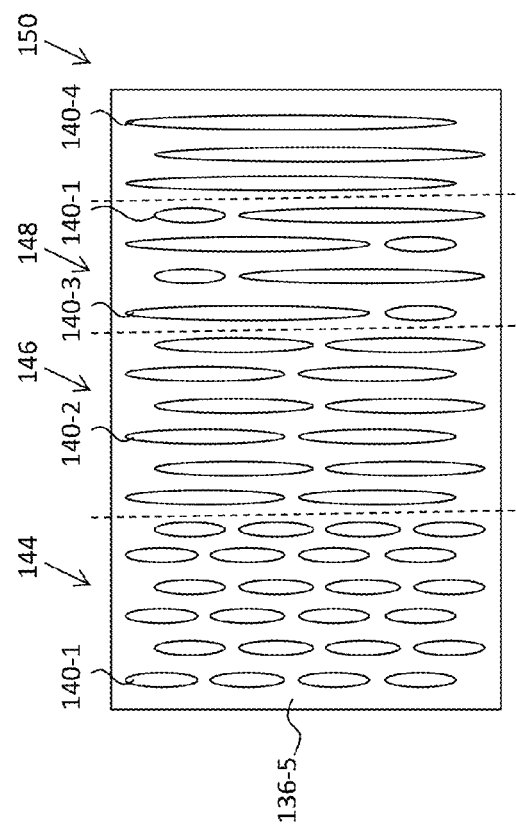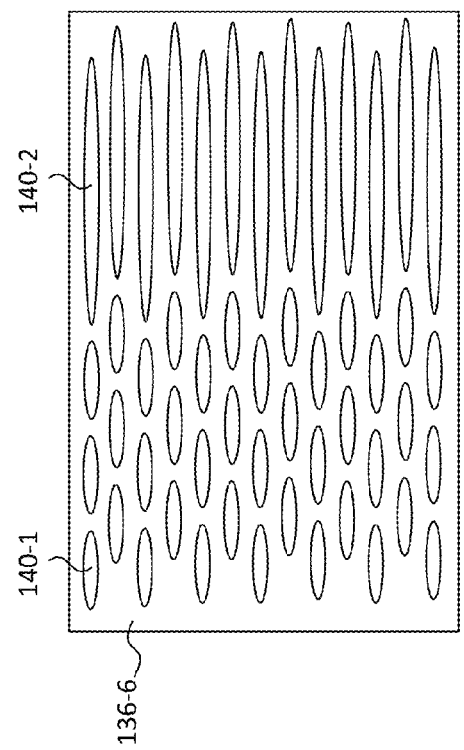
FIG. 5A
FIG. 5B

GAS DELIVERY FOR UNIFORM FILM PROPERTIES AT UV CURING CHAMBER

FIELD OF DISCLOSURE

The disclosed system and method relate to semiconductor processing. More particularly, the disclosed system and method relate to UV curing for semiconductor processing.

BACKGROUND

Semiconductor processing typically includes numerous steps in order to process a single wafer. Dielectric materials are often deposited onto a semiconductor wafer during processing. Many of these dielectric materials and other materials are cured using ultraviolet ("UV") light, which is directed at a wafer when the wafer is disposed in a UV curing chamber. Such UV curing chambers include a window through which the UV light is irradiated. The window is typically made of a single sheet of quartz as quartz is highly transparent to UV radiation.

BRIEF DESCRIPTION OF THE DRAWINGS

FIG. 2 is a plan view of one example a quartz window in accordance with the UV curing system illustrated in FIG. 1.

FIG. 3 is a plan view of another example of a quartz window in accordance with the UV curing system illustrated in FIG. 1.

FIGS. 4A and 4B are plan views of other examples of quartz windows in accordance with the UV curing system illustrated in FIG. 1.

FIGS. 5A and 5B are plan view of other examples of quartz windows in accordance with the UV curing system illustrated in FIG. 1.

DETAILED DESCRIPTION

Figure 1:
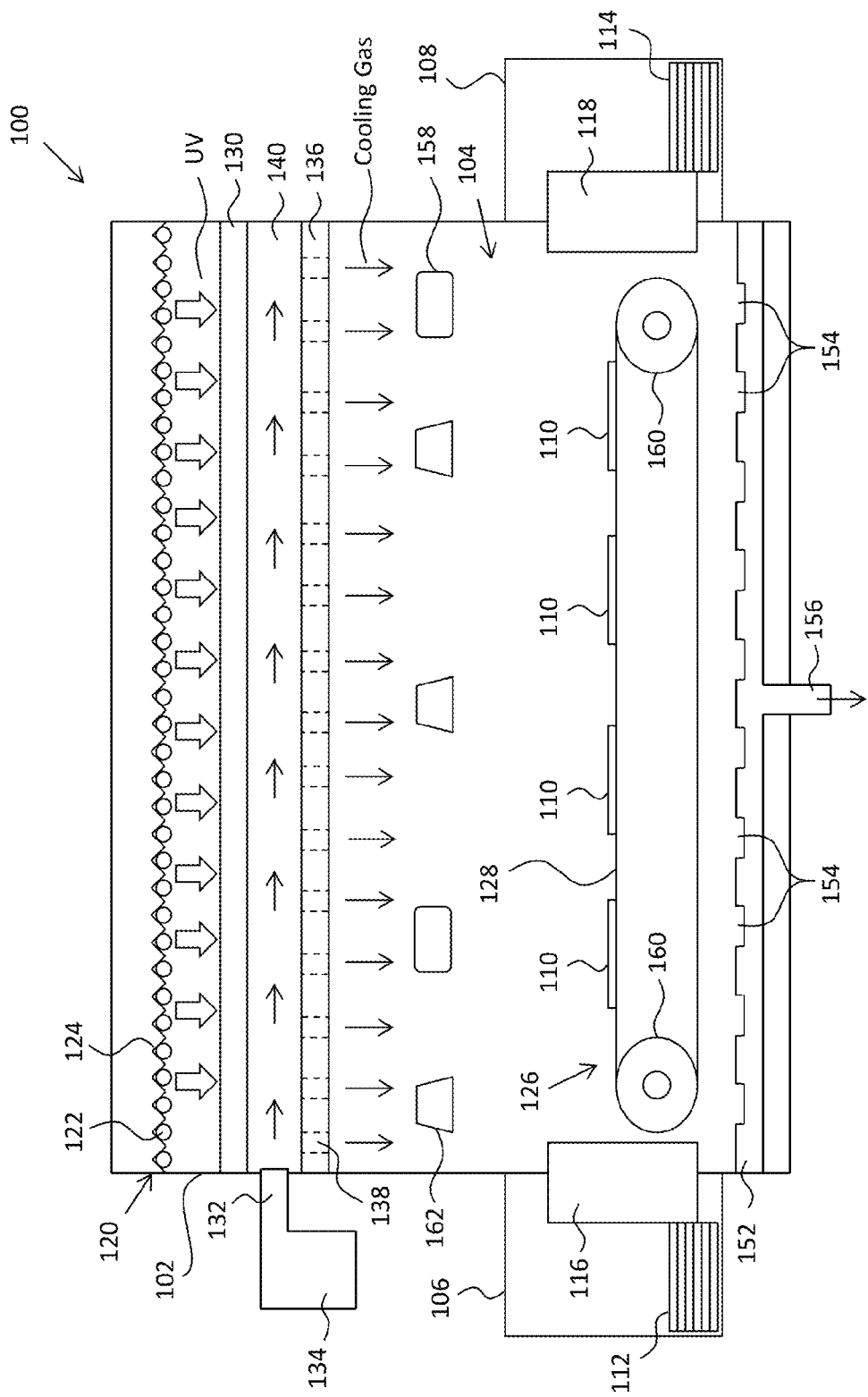
FIG. 1 is a cross-sectional view of one example of a UV curing system in accordance with some embodiments.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected," "interconnected," "coupled," "attached," etc. refer to a relationship wherein structures are secured or attached to one another either directly or indirectly through intervening structures, as well as both movable or rigid attachments or relationships, unless expressly described otherwise.

FIG. 1 is a cross-sectional view of one example of an ultraviolet ("UV") curing system 100. The curing system 100 includes an enclosure 102 defining a UV irradiation processing chamber 104. Wafer load lock chambers 106, 108 are disposed at opposed sides of enclosure 102 for loading and unloading wafers 110 from the processing chamber 104. In some embodiments, load lock chamber 106 is an entry load lock chamber and load lock chamber 108 is an exit load lock chamber.

Each load lock chamber 106, 108 includes an outer housing provided with two opposing access doors (not shown): one outer access door to atmosphere for receiving wafers 110 from an external source, and another inner access door to processing chamber 102 for loading wafers from the load lock chamber into the processing chamber. In some embodiments, an automated material handling system ("AMHS") is used to deliver a wafer cassette or carrier such as a front opening unified pod ("FOUP") holding a plurality of unprocessed wafers 112 to the entry load lock chamber 106. Another empty wafer carrier may be positioned at exit load lock chamber 108 to receive UV processed wafers 114.

The inner access doors to curing oven chamber 102 are openable/closeable and include seals that are configured to seal the processing chamber 102 to allow a controlled process environment to be established inside chamber 102. The outer access doors provided in the load lock chambers 106, 108 housing for external access may further be openable/closeable and include suitable seals configured to allow each load lock chamber 106, 108 to be isolated from the external ambient facility environment. In some embodiments, the externally positioned access doors 108 may be configured for docking a wafer carrier such as a FOUP which holds multiple wafers.

Each load lock chamber 106, 108 includes a respective wafer handling robot 116, 118 that is operable to retrieve/receive and load wafers 110 into processing chamber 104, and to remove the UV cured wafer from the processing chamber at the other end. Wafer handling robots are commercially available and their specific features are not disclosed herein. One of ordinary skill in the art will understand that in some embodiments robots 116, 118 can include a magnetic floating motor, an extendible and mechanically articulating robotic feed arm, including swivel joints, and a wafer grasping blade disposed on an end of the feed arm configured for grasping and releasing a wafer 110.

In some embodiments, such as the embodiment illustrated in FIG. 1, chamber 104 is tunnel-shaped, having a greater length than width in the direction of the wafer process flow from the entry load lock chamber 116 to the exit load lock chamber 108. In some embodiments, chamber 104 has a circular geometry and is therefore not tunnel shaped as will be understood by one of ordinary skill in the art. In tunnel-shaped embodiments, the tunnel shape increases the exposure time of the wafers 110 to the UV light to improve curing performance by producing more uniform wafer irradiation and heating. System 100 is configured to process more than one wafer at a time allowing for mass production and productivity improvements over curing ovens capable of processing a single wafer alone. System 100 can be configured to process only a single wafer at a time in other embodiments.

With continuing reference to FIG. 1, the UV curing system further includes a UV light source 120 comprising an array or plurality of UV lamps 122 that emit UV wavelength radiation. Wafers 110 are positioned in optical view of lamp unit 120 within processing chamber 102 to receive UV radiation for film curing. The lamps 122 may be mounted by appropriate lamp holders which are supported by a portion of the oven enclosure 102. In some embodiments, for example, lamp unit 120 is fixed and stationary in position. In some embodiments, reflectors 124 are positioned above and include portions extending vertically at least partially in between each of the lamps 122 to reflect the UV light downwards towards the processing chamber 104, thereby enhancing the irradiation and curing of a dielectric film such as a low-K film previously deposited on the wafer 110 by any suitable means including, but not limited to, chemical vapor deposition ("CVD") or spin-on. The low-K film may be any type of material including, but not limited to, Black Diamond® from Applied Materials or SiLK® from Dow Chemical.

Reflectors 124 are positioned proximate to lamps 122 to maximize reflection of the UV radiation. Reflectors 124 may have any suitable configuration, and in the exemplary embodiment shown has an undulating angled or zigzag pattern. Individual lamps 122 are positioned within each recess formed by the angled reflector unit. In other embodiments, the reflectors may be concave shaped where an individual lamp 122 is positioned below each of a plurality of concave shaped reflectors similarly to the angle reflector arrangement. Reflectors 124 can be made of any suitable coated or uncoated metal having a reflective surface finish or coating which is operable to reflect UV radiation. In some embodiments, without limitation, the reflectors may be formed of aluminum.

Any suitable type of UV lamps 122 or source can be used including, but not limited to, mercury and excimer lamps, mercury microwave arc lamps, pulsed xenon flash lamps, UV light emitting diodes, to name only a few possible UV sources. In some embodiments, for example, UV lamps 122 are elongated tube-type UV lamps which are arranged in spaced and parallel relationship to each other along the length and longitudinal direction of the chamber 104. As will be understood by one of ordinary skill in the art, UV lamps 122 can be powered by any suitable power supply and are selected to produce UV radiation having any appropriate wavelength for the process requirements encountered. In some embodiments, for example, the UV radiation wavelength used is in the range from about 193 nm to about 500 nm.

The combination of reflectors 124 and lamps 122 produce a UV irradiance pattern (see downwards UV ray arrows) that covers a majority of the stage or platform 126, which as illustrated in FIG. 1, takes the form of a moving belt conveyor 126. The UV irradiance pattern covers at least the portions of the belt 128 (or stage or platform) on which the wafers 110 are disposed such that all portions of the wafers 110 are irradiated uniformly. In some embodiments, the UV irradiance pattern forms a generally rectilinear (e.g. rectangular or square) irradiance illumination profile on the belt 128 that is at least the same size as the belt in some embodiments. For example, at least two lamps 122 are provided in various embodiments to form an array of lamps that extends longitudinally over a majority of the length of belt 128. Lamps 122 are arranged with the length of the tube-type lamps being arranged and oriented laterally to extend across the width of the chamber 104. This arrangement minimizes the length of the lamps 122 for the array. In some embodiments, the irradiance pattern can be circular or have another geometric shape that corresponds to the shape of the chamber 104 and stage or platform 126 on which wafers 110 are disposed.

A first UV transparent window 130, such as a quartz window, separates and isolates the active wafer processing chamber 104 and UV lamp unit 120. Quartz window 130 is therefore positioned and seated in the enclosure 102 above the wafers 110 to operatively seal the processing chamber 104 from the ambient environment and UV lamp unit 120. The window 130 prevents out-gassing from the wafers 110 from reaching and contaminating the UV lamps 122. The quartz window 130 operates to allow UV wavelength radiation from the lamp unit 120 to be transmitted and pass through the window and irradiate a wafer 110 positioned below the window. In one example, process window 130 is made of synthetic quartz. In some embodiments, quartz ($SiO_2$) window 130 has a size sufficient to cover all regions of lamp array 120 to separate lamp array 120 from processing chamber 104.

System 100 also includes a gas cooling system that supplies an inert gas to processing chamber 104. The cooling gas maintains temperatures in processing chamber 104 at a desired level, which may be below 450 degrees Celsius in some representative non-limiting embodiments. The cooling gas also serves as a purge gas to help remove various organic compounds or other species outgassed from wafers 110 during UV processing. In some embodiments, nitrogen ($N_2$) is used as the cooling gas; however, other suitable inert or noble gases may be used.

The cooling gas is introduced into the processing chamber 104 through one or more inlet conduits 132 from gas source 134. Inlet conduit(s) 132 are disposed at an upper area of processing chamber 104 such that inlet conduit(s) 132 are disposed adjacent to quartz window 130. A second quartz window 136 is disposed at the upper area of processing chamber 104 at a distance from first quartz window 130 to define a cooling gas channel 140. Second quartz window 136 defines a plurality of openings, which in some embodiments take the form of holes 138, to provide fluid communication between cooling gas channel 140 and processing chamber 104. The number, size, shape, and pattern of holes 138 formed in second quartz window 136 may vary. For example, FIG. 2 is a plan view of one example of quartz window 136-1 including a plurality of holes 138 in an arrangement in which holes 138 in adjacent rows and columns are offset from one another, i.e., they are not linearly aligned with one another. In some embodiments, holes 138 have a diameter of 2 mm and are spaced apart from each other by 15 mm.

Holes 138 can have other diameters and spacing to provide a uniform cooling gas flow through second quartz window 136 into chamber 104. For example, FIG. 3 illustrates a quartz window 136-2 comprising a plurality of holes 138 of different sizes in accordance with various embodiments of the present disclosure. As shown in FIG. 3, holes 138-1, which are positioned at the left side of window 136-2 and are the closest to the gas inlet conduit(s) 132, have a first diameter that is smaller than the diameter of holes 138-2 and 138-3. Holes 138-2, which are defined by the middle section of window 136-2, have a diameter that is greater than the diameter of holes 138-1 and smaller than the diameter of holes 138-3. By positioning the smaller holes 138-1 closer to gas inlet conduit(s) 132 and the larger holes 138-3 farther away from gas inlet conduit(s), the cooling gas is more evenly distributed in chamber 104 over wafers 110. Although second quartz window 136 is illustrated in FIG. 1 (and FIGS. 2-5B, which are described below) as having a rectangular shape, second quartz window 136 can take other geometric shapes depending on the configuration of the UV curing chamber.

In some embodiments, holes 138 can be replaced by openings having other geometries. For example, FIGS. 4A and 4B illustrate examples of windows 136-3, 136-4, respectively, in which holes 138 are replaced by slots 142. Slots 142 in FIG. 4A have a length that extend in a direction that is parallel to the widthwise direction of window 136-3, and slots 142 in FIG. 4A have a length that extend in a direction that is parallel to a lengthwise direction of window 136-4.

Slots 142, like holes 138, can have different geometries and dimensions to facilitate a more uniform distribution of the cooling gas in chamber 104. FIG. 5A illustrates one example of a window 136-5 defining a plurality of slots 142-1, 142-2, 142-3, 142-4 having different sizes. Slots 142-1 extend in a direction that is parallel to a widthwise direction of window 136-5. The majority of slots 142-1 are disposed in area 144 at the left side of window 136-5 such that slots 142-1 are disposed closest to gas inlet conduit(s) 132. Slots 142-2 are disposed in area 146, extend parallel to slots 142-2, and have a length that is greater than the length of slots 142-1 and less than the length of slots 142-3 and 142-4.

Area 148 includes slots 142-3 and slots 142-1 that extend in a direction that is parallel to the widthwise direction of window 136-5. Slots 142-3 have a length that is greater than a length of slots 142-1 and 142-2 and less than a length of slots 142-4. Slots 142-4 are disposed in area 150 of window 136-5 that is farthest away from gas inlet conduit(s) 132 and have the longest lengths.

FIG. 5B illustrates another example of a window 136-6 comprising a plurality of slots 142-1, 142-2 having different lengths. Slots 142-1 and 142-2 are arranged on window 136-6 such that the lengthwise directions of slots 142-1, 142-2 are parallel to the lengthwise direction of window 136-6. Slots 142-1 are disposed at the left of window 136-6 such that they are disposed closer to gas inlet conduit(s) 132, and slots 142-2 are disposed at the right side of window 136-6 and have lengths that are longer than the lengths of slots 142-1. The openings defined by second quartz window 136 can include combination of holes, slots, and/or openings that facilitate gas transfer between gas channel 140 and processing chamber 104.

Regardless of the implementation of second quartz window 136, cooling gas is introduced into enclosure 102, and more particularly directly into gas channel 140, by gas inlet conduit(s) 132 and are received within gas cooling channel 140. The cooling gas is drawn into and removed from the process chamber 104 by an outlet tubing header 152 containing multiple holes 154 connected to an outlet conduit 156. Out-gassing from wafers 110 during UV curing is removed from processing chamber 104 along with the inert cooling gas through outlet conduit 156.

In some embodiments, outlet conduit 156 is connected to a vacuum source such as a vacuum pump such that chamber 104 is operated under a pressure that is less than atmospheric. For example, the processing chamber 104 can be held at a vacuum, atmospheric (<10 torr), or positive pressures.

The UV curing process is sensitive to oxygen ($O_2$) in the processing chamber 104. Accordingly, in some embodiments, one or more $O_2$ sensors 158 as shown in FIG. 1 may be provided to monitor $O_2$ levels during the curing process and detect if levels become high enough to present potential processing problems.

In some embodiments, UV curing system 100 includes a belt conveyor 126 configured for moving wafers 110 through the oven 100. Belt conveyor 126 includes a belt 128, which is mounted and travels between at least two pulleys 160. At least one pulley 160 is a driven pulley rotated by a suitable electric motor drive (not shown), which turns the pulley 160 and drives the belt 128. The belt conveyor 126 operates to linearly move wafers 110 through curing oven 100 along its length in a longitudinal direction from the entry load lock chamber 106 to the exit load lock chamber 108.

Conveyor belt 126 may be made of any suitably structured and type of material capable of being resistant to and withstanding UV radiation, heat within curing oven 100, and corrosion from out-gassing and oven cleaning gas chemistries. In some embodiments, for example, a flexible metal wire mesh conveyor belt material may be used which is fabricated from wire or sheets which are woven, knitted, perforated, expanded, or otherwise formed into a flexible belt capable of traveling around pulleys 160. The metal mesh belts include open areas through which cooling gas may flow between the wafers 110 during processing and cleaning gases when the curing oven 100 is periodically cleaned to remove organic deposits that form inside the oven during processing. In some embodiments, the material used for a metal wire mesh belt 128 may be aluminum, titanium, steel (including stainless steel), nickel, copper, platinum, metal alloys thereof, or other suitable metals and alloys. In some embodiments, an aluminum or aluminum alloy mesh belt is used.

With continuing reference to FIG. 1, UV curing oven 100 in some embodiments includes a gas cleaning system. During operation, organic material deposits form on the walls, quartz windows 130, 136, and conveyor 126 in the processing chamber 104 during the UV wafer curing. The curing produces out-gassing containing the organic compounds from the wafers 110 and low-K dielectric films thereon. Periodically between UV curing cycles, remote plasma cleaning ("RPC") is performed by introducing a cleaning gas such as $O_2$ into the chamber 104 through multiple flow nozzles 162. Reaction of the gas with UV radiation by lamp unit 120 produces ozone which removes the organic deposits from within the chamber 104. The "dirty" cleaning gas stream may be removed from chamber 104 via outlet conduit 156.

The UV curing process performed in curing oven 100 may be conducted at any suitable pressure and temperature. In some embodiments, an operating temperature range within about and including 300 to about and including 410 degrees C. is used. In general, temperatures above 410 degrees C. are not recommended due to wafer thermal budget and device concerns. Operating pressure is within 1-10 Torr in some embodiments for better curing uniformity control.

In some embodiments, the operation of the UV curing system and oven 100 is controlled by a processor-based controller (not shown) that is operably associated with the oven 100. Such controllers function to actuate the UV lamp array 120, belt conveyor 126, gas flow, wafer loading/unloading operations, cleaning cycles, etc. To make sure the intensity of UV lamp array 120 is within control limits, a real time UV intensity monitor system is used in some embodiments to provide feedback to the system. If UV lamp intensity drops to 95%, for example, an alarm system triggers the system or operator to stop production. Within 95%-100% UV intensity, for example, auto tuning of the UV lamp power is controlled by a power controller or unit (not shown) to control power (intensity) to make sure the curing performance is uniform from wafer to wafer.

Figure 6:
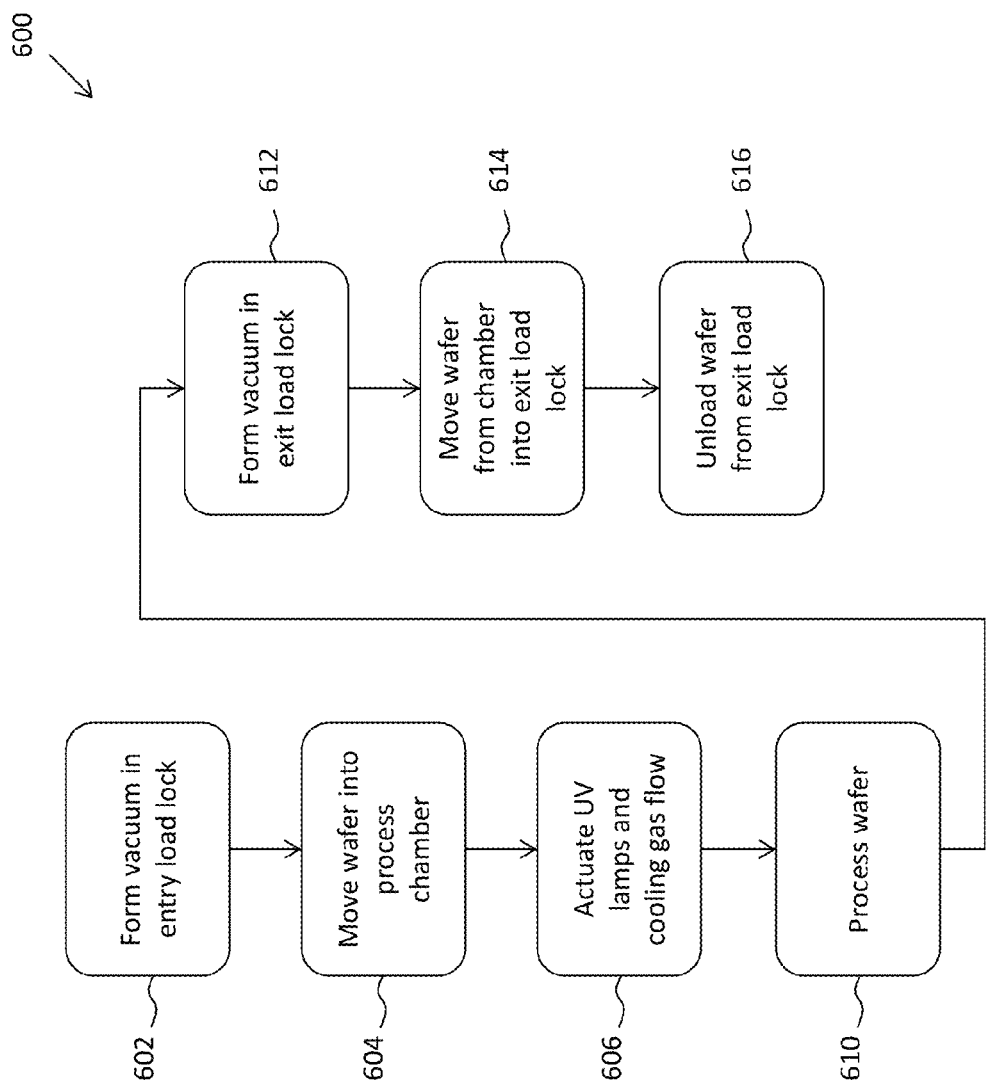
FIG. 6 is a flow diagram of one example of a method of UV curing a wafer using a UV curing system in accordance with some embodiments.

An exemplary method for curing wafers in the UV curing system disclosed herein will now be presented with reference to FIGS. 1 and 6, in which FIG. 6 is a flow diagram of one example of a method 600 of a UV curing process. In some embodiments, processing chamber 104 is operated under a vacuum.

As shown in FIG. 6, a vacuum is formed in entry load lock 106 at block 602. The vacuum is formed in entry load lock 106 that includes a stack 112 of one more unprocessed wafers 110.

At block 604, a wafer 110 is loaded through the inner access door into the processing chamber 104 and onto conveyor belt 126 by robot 116. Robot 116 can be initially used in step 602 to load the wafer 110 into entry load lock chamber 106.

The UV lamp unit 120 and cooling gas flow are initiated at block 606. As described above, cooling gas is provided by gas source 134 and introduced into cooling gas channel 140 defined between quartz windows 130 and 136 by gas inlet conduit(s) 132. The cooling gas is directed from cooling gas channel into processing chamber 104 through holes 138 (or slots 142) defined by second quartz window 136. The cooling gas is drawn into and removed from the process chamber 104 by an outlet tubing header 152 containing multiple holes 154 connected to an outlet conduit 156. Out-gassing from wafers 110 during UV curing is removed from processing chamber 104 along with the inert cooling gas through outlet conduit 156.

Figure 7B:
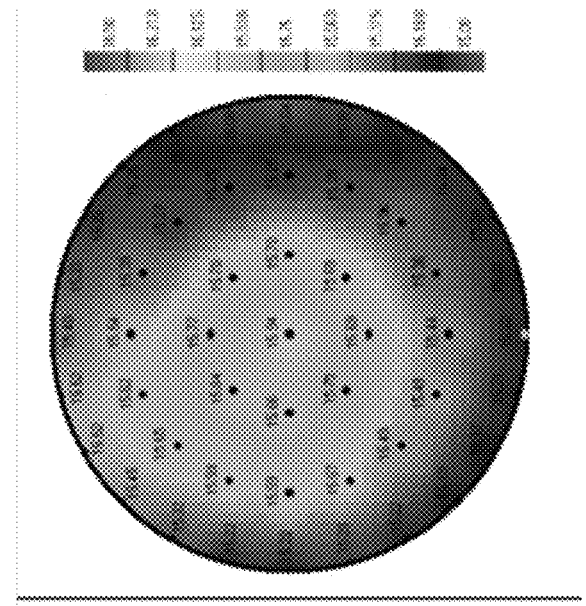
FIGS. 7A and 7B are shrinkage graphs for comparing a wafer cured using a conventional UV curing oven (FIG. 7A) and a wafer cured using a UV curing oven in accordance with some embodiments of the present disclosure (FIG. 7B).
Figure 7A:
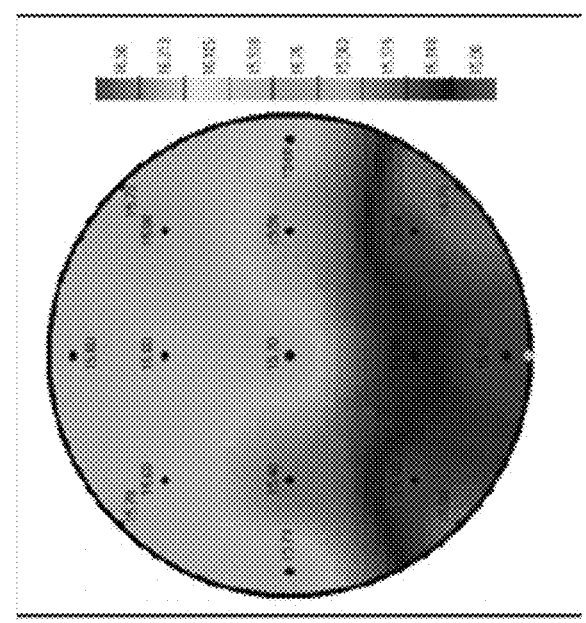

Introducing the cooling gas into processing chamber 104 through holes 138 (or slots 142) defined by second quartz window 136 advantageously improves the uniformity of the cooling gas (and thus the temperature) within processing chamber 104, which in turn improves the uniformity of the UV cure. For example, FIG. 7A is graph illustrating the shrinkage of a wafer cured in a conventional UV curing oven that did not include the perforated quartz window. The cure time was 200 seconds, and the film shrinkage uniformity measurement was 2.1%. FIG. 7B is a graph illustrating the shrinkage of a wafer cured in a UV curing oven in accordance with the embodiment illustrated in FIG. 1. The cure time for the graph illustrated in FIG. 7B was 170 seconds, and the film shrinkage uniformity measurement was 1.5%. The size of holes was about 2 mm with 1100 holes being defined by a 370 mm diameter second quartz window 136. The process used 16,000 sccm HE and 1,600 AR gas to cure at 6.5 Torr, which generated the results illustrated in FIGS. 7A and 7B.

Referring again to FIG. 6, the wafer is processed at block 610. In some embodiments, such as the embodiment illustrated in FIG. 1, belt conveyor 126 moves wafers 110 through enclosure 102. In embodiments in which UV curing system does not include a conveyor system 126, wafer 110 can be processed by placing wafer 110 on a pedestal, which may be a heater, and exposing the wafer to UV radiation. As described above, a processor-based controller (not shown) actuates the UV lamp array 120, belt conveyor 126 (if applicable), and gas flow at block 610. The processor-based controller also monitors and controls the intensity of UV lamp array 120.

At block 612, a vacuum is formed in exit load lock 108. The processed wafer(s) 110 are moved from processing chamber 104 into the exit load lock 108 at block 614. As will be understood by one of ordinary skill in the art, robot 118 can move a processed wafer 110 into exit load lock 108 and to provide a stack of processed wafers 114. The processed wafers 114 are unloaded from exit load lock at block 616.

The disclosed systems and methods herein utilize a second quartz window that includes a plurality of openings, which advantageously enables cooling gas to be more evenly distributed within the processing chamber. The even distribution of the cooling gas enables a more even UV curing of wafers.

In some embodiments, a UV curing system includes an enclosure defining an interior, a UV radiation source disposed within the interior of the enclosure, and a first window disposed within the interior of the enclosure. The first window creates a barrier that separates the UV radiation source and a processing chamber. A second window is disposed within the interior of the enclosure at a distance from the first window to define a gas channel. The second window defines a plurality of openings such that the gas channel is in fluid communication with the processing chamber. A gas inlet conduit is in fluid communication with the gas channel and is configured to introduce a cooling gas into the gas channel. A gas outlet is in fluid communication with the processing chamber and is configured to remove gas from the processing chamber.

In some embodiments, the plurality of openings include a plurality of holes arranged in an array.

In some embodiments, a first number of the plurality of holes have a first diameter, and a second number of the plurality of holes have a second diameter that is greater than the first diameter.

In some embodiments, the second number of the plurality of holes are disposed farther away from the gas inlet conduit than the first number of the plurality of holes.

In some embodiments, the plurality of openings include a plurality of slots.

In some embodiments, the first and second windows are formed from quartz.

In some embodiments, the gas inlet conduit is coupled to a gas source configured to provide the cooling gas.

In some embodiments, the gas channel is disposed above the processing chamber and the gas outlet is disposed at a bottom of the processing chamber.

In some embodiments, a method of processing a wafer includes introducing a cooling gas into a gas channel defined between a first window that is disposed adjacent to a UV radiation source and a second window that is disposed at a distance from the first window. The second window defines a plurality of openings such that the cooling gas introduced into the gas channel is received within a processing chamber. A film disposed on wafer disposed within the processing chamber is cured by energizing the UV light source such that UV radiation passes through the first and second windows toward an upper surface of the wafer. Gas is from the processing chamber through a gas outlet that is in fluid communication with the processing chamber.

In some embodiments, the plurality of openings include a plurality of holes arranged in an array.

In some embodiments, a first number of the plurality of holes have a first diameter, and a second number of the plurality of holes have a second diameter that is greater than the first diameter.

In some embodiments, the second number of the plurality of holes are disposed farther away from the gas inlet conduit than the first number of the plurality of holes.

In some embodiments, the plurality of openings include a plurality of slots.

In some embodiments, the first and second windows are formed from quartz.

In some embodiments, introducing the cooling gas includes providing the cooling gas from a gas source to a gas inlet conduit that is in direct fluid communication with the gas channel.

In some embodiments, a UV curing system includes an enclosure defining an interior, a UV radiation source disposed at an upper end of the interior, and a first window disposed within the interior of the enclosure adjacent to the UV radiation source. The first window creates a barrier that separates the UV radiation source and a processing chamber disposed below the UV radiation source. A second window is disposed within the interior of the enclosure at a distance from the first window to define a gas channel therebetween. The second window defines a plurality of openings such that the gas channel is in fluid communication with the processing chamber that is disposed below the second window. A gas inlet conduit is configured to introduce a cooling gas into the processing chamber. A gas outlet is disposed at a bottom of the processing chamber and is configured to remove gas from the processing chamber.

In some embodiments, the gas outlet is disposed beneath a platform configured to support one or more wafers.

In some embodiments, the first and second windows are transparent to UV radiation.

In some embodiments, the plurality of openings includes a plurality of holes.

In some embodiments, the plurality of openings includes a plurality of slots.

The disclosed systems and methods described herein can be at least partially embodied in the form of program code embodied in tangible media, such as floppy diskettes, CD-ROMs, DVD-ROMs, Blu-ray disks, hard drives, or any other tangible and/or non-transient machine-readable storage medium, wherein, when the program code is loaded into and executed by a machine, such as a computer, the machine becomes an apparatus for practicing the invention. The discloses systems and methods can also be at least partially embodied in the form of program code, for example, whether stored in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the method. When implemented on a general-purpose processor, the program code segments combine with the processor to provide a unique device that operates analogously to specific logic circuits.

Although the systems and methods has been described in terms of exemplary embodiments, they are not limited thereto. Rather, the appended claims should be construed broadly, to include other variants and embodiments of the systems and methods, which may be made by those skilled in the art without departing from the scope and range of equivalents of the systems and methods.

What is claimed is:

1. A UV curing system, comprising:
an enclosure defining an interior;
a UV radiation source disposed within the interior of the enclosure;
a first window disposed within the interior of the enclosure, the first window creating a barrier that separates the UV radiation source and a processing chamber;
a second window disposed within the interior of the enclosure at a distance from the first window to define a gas channel between the first window and second window, the second window defining a plurality of openings such that the gas channel is in fluid communication with the processing chamber, wherein a first number of the plurality of openings have a first size and a second number of the plurality of openings have a second size greater than the first size;
a gas inlet in fluid communication with the gas channel and configured to introduce a cooling gas into the gas channel; and
a gas outlet in fluid communication with the processing chamber and configured to remove gas from the processing chamber.

2. The UV curing system of claim 1, wherein the plurality of openings include a plurality of holes arranged in an array.

3. The UV curing system of claim 2, wherein a first number of the plurality of holes have a first diameter and a second number of the plurality of holes have a second diameter that is greater than the first diameter.

4. The UV curing system of claim 3, wherein the second number of the plurality of holes are disposed farther away from the gas inlet conduit than the first number of the plurality of holes.

5. The UV curing system of claim 1, wherein the plurality of openings include a plurality of elongate slots.

6. The UV curing system of claim 1, wherein the first and second windows are formed from quartz.

7. The UV curing system of claim 1, wherein the gas inlet is coupled to a gas source configured to provide the cooling gas.

8. The UV curing system of claim 1, wherein the gas channel is disposed above the processing chamber and the gas outlet is disposed at a bottom of the processing chamber.

9. A method of processing a wafer, comprising:
introducing a cooling gas into a gas channel defined between a first window that is disposed adjacent to a UV radiation source and a second window that is disposed at a distance from the first window, the second window defining a plurality of openings such that the cooling gas introduced into the gas channel is received within a processing chamber, wherein a first number of the plurality of openings have a first size and a second number of the plurality of openings have a second size greater than the first size;
curing a film disposed on wafer disposed within the processing chamber by energizing the UV light source such that UV radiation passes through the first and second windows toward an upper surface of the wafer; and
removing gas from the processing chamber through a gas outlet that is in fluid communication with the processing chamber.

10. The method of claim 9, wherein the plurality of openings include a plurality of holes arranged in an array.

11. The method of claim 10, wherein a first number of the plurality of holes have a first diameter and a second number of the plurality of holes have a second diameter that is greater than the first diameter.

12. The method of claim 11, wherein the second number of the plurality of holes are disposed farther away from the gas inlet than the first number of the plurality of holes.

13. The method of claim 9, wherein the plurality of openings include a plurality of elongate slots.

14. The method of claim 9, wherein the first and second windows are formed from quartz.

15. The method of claim 9, wherein introducing the cooling gas includes providing the cooling gas from a gas source to a gas inlet conduit that is in direct fluid communication with the gas channel.

16. A UV curing system, comprising:
an enclosure defining an interior;
a UV radiation source disposed at an upper end of the interior;
a first window disposed within the interior of the enclosure adjacent to the UV radiation source, the first window creating a barrier that separates the UV radiation source and a processing chamber disposed below the UV radiation source;
a second window disposed within the interior of the enclosure at a distance from the first window to define a gas channel therebetween, the second window defining a plurality of openings such that the gas channel is in fluid communication with the processing chamber that is disposed below the second window, wherein a first number of the plurality of openings have a first size and a second number of the plurality of openings have a second size greater than the first size;
a gas inlet configured to introduce a cooling gas into the processing chamber; and
a gas outlet disposed at a bottom of the processing chamber and configured to remove gas from the processing chamber.

17. The UV curing system of claim 16, wherein the gas outlet is disposed beneath a platform configured to support one or more wafers.

18. The UV curing system of claim 16, wherein the first and second windows are transparent to UV radiation.

19. The UV curing system of claim 16, wherein the plurality of openings includes a plurality of holes.

20. The UV curing system of claim 16, wherein the plurality of openings includes a plurality of elongate slots.

* * * * *